(12) United States Patent
Mu

(10) Patent No.: US 9,634,614 B2
(45) Date of Patent: Apr. 25, 2017

(54) DISTRIBUTED POWER AMPLIFIER CIRCUIT

(71) Applicant: Telefonaktiebolaget L M Ericsson (Publ), Stockholm (SE)

(72) Inventor: Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/768,952

(22) PCT Filed: Feb. 19, 2014

(86) PCT No.: PCT/EP2014/053223
§ 371 (c)(1),
(2) Date: Aug. 19, 2015

(87) PCT Pub. No.: WO2014/128158
PCT Pub. Date: Aug. 28, 2014

(65) Prior Publication Data
US 2016/0006400 A1 Jan. 7, 2016

Related U.S. Application Data

(60) Provisional application No. 61/772,263, filed on Mar. 4, 2013.

(30) Foreign Application Priority Data

Feb. 25, 2013 (EP) .................................. 13156507

(51) Int. Cl.
*H03F 3/68* (2006.01)
*H03F 1/02* (2006.01)
(Continued)

(52) U.S. Cl.
CPC ......... *H03F 1/0288* (2013.01); *H03F 1/0277* (2013.01); *H03F 1/18* (2013.01);
(Continued)

(58) Field of Classification Search
CPC ........ H03F 1/0288; H03F 1/0277; H03F 1/18; H03F 3/195; H03F 3/211; H03F 3/213;
(Continued)

(56) References Cited

U.S. PATENT DOCUMENTS 3,675,145 A 7/1972 Beurrier
3,919,660 A 11/1975 Beurrier
(Continued)

FOREIGN PATENT DOCUMENTS

CN 1296663 A1 5/2001
CN 1561573 A1 1/2005
(Continued)

OTHER PUBLICATIONS

Liu et al., "Fully Integrated CMOS Power Amplifier With Efficiency Enhancement at Power Back-Off",IEEE Journal of Solid-State Circuits, vol. 43, No. 3, Mar. 2008, pp. 600-609.*
(Continued)

*Primary Examiner* — Steven J Mottola
*Assistant Examiner* — Hafizur Rahman
(74) *Attorney, Agent, or Firm* — Christopher & Weisberg, P.A.

(57) ABSTRACT

A distributed power amplifier circuit is disclosed. The distributed power amplifier circuit comprises an amplifier arrangement comprising a plurality of sub amplifiers, each having an output port for outputting an output signal of the sub-amplifier and an output combiner network for combining the output signals from the sub amplifiers. The output combiner network includes, for each sub amplifier, an associated auto transformer operatively connected to the output
(Continued)

port of the sub amplifier for receiving the output signal of the sub amplifier. The auto transformers each have a first interconnection terminal and a second interconnection terminal. The auto transformers are operatively connected in series via the interconnection terminals, thereby forming a chain of auto transformers having a first end and a second end, wherein the first end is arranged to be connected to an antenna.

19 Claims, 6 Drawing Sheets

(51) Int. Cl.
    *H03F 1/18*     (2006.01)
    *H03F 3/195*     (2006.01)
    *H03F 3/21*     (2006.01)
    *H03F 3/24*     (2006.01)
    *H03F 3/72*     (2006.01)
    *H03F 3/213*     (2006.01)
    *H04L 27/26*     (2006.01)
    *H04W 52/02*     (2009.01)

(52) U.S. Cl.
    CPC ............ *H03F 3/195* (2013.01); *H03F 3/211* (2013.01); *H03F 3/213* (2013.01); *H03F 3/245* (2013.01); *H03F 3/72* (2013.01); *H04L 27/2614* (2013.01); *H04W 52/0206* (2013.01); *H04W 52/0261* (2013.01); *H03F 2200/451* (2013.01); *H03F 2200/516* (2013.01); *H03F 2200/537* (2013.01); *H03F 2200/541* (2013.01); *H03F 2203/21145* (2013.01); *H03F 2203/7221* (2013.01)

(58) Field of Classification Search
    CPC ...... H03F 3/245; H03F 3/72; H03F 2200/451; H03F 2200/516; H03F 2200/537; H03F 2200/541; H03F 2203/21145; H03F 2203/7221; H04L 27/2614; H04W 52/0206; H04W 52/0261
    USPC ....... 330/192, 195, 197, 252, 275, 276, 286, 330/295, 301, 307
    See application file for complete search history.

(56) References Cited

U.S. PATENT DOCUMENTS

| | | | |
|---|---|---|---|
| 5,930,128 A | 7/1999 | Dent | |
| 6,229,398 B1 | 5/2001 | Auric et al. | |
| 6,856,199 B2 | 2/2005 | Komijani et al. | |
| 7,119,619 B2 | 10/2006 | Komijani et al. | |
| 7,224,229 B2 | 5/2007 | Belot | |
| 7,330,076 B2 | 2/2008 | Komijani et al. | |
| 7,372,336 B2 | 5/2008 | Lee et al. | |
| 7,439,841 B2 | 10/2008 | Kim | |
| 7,733,183 B2 | 6/2010 | Komijani et al. | |
| 7,889,009 B2 | 2/2011 | Jen et al. | |
| 8,018,283 B2 | 9/2011 | Komijani et al. | |
| 8,049,564 B2 | 11/2011 | Palotta | |
| 9,020,449 B2* | 4/2015 | Gupta ................. | H04B 1/0003 455/127.1 |
| 2003/0169113 A1 | 9/2003 | Komijani et al. | |
| 2005/0140447 A1 | 6/2005 | Komijani et al. | |
| 2005/0189994 A1 | 9/2005 | Belot | |
| 2006/0170503 A1 | 8/2006 | Lee et al. | |
| 2007/0030071 A1 | 2/2007 | Komijani et al. | |
| 2007/0090913 A1 | 4/2007 | Kim | |
| 2008/0204139 A1 | 8/2008 | Komijani et al. | |
| 2008/0316775 A1 | 12/2008 | Tsai et al. | |
| 2009/0160250 A1 | 6/2009 | Huang | |
| 2010/0019857 A1* | 1/2010 | McMorrow ............... | H03F 1/56 333/32 |
| 2010/0164628 A1 | 7/2010 | Pallotta | |
| 2010/0244955 A1 | 9/2010 | Komijani et al. | |
| 2010/0244962 A1 | 9/2010 | Jen et al. | |
| 2012/0001692 A1 | 1/2012 | Komijani et al. | |
| 2013/0127528 A1* | 5/2013 | Choi ..................... | H03F 1/0261 330/124 R |

FOREIGN PATENT DOCUMENTS

| | | |
|---|---|---|
| CN | 101816123 B1 | 8/2014 |
| EP | 1677415 A1 | 7/2006 |
| EP | 2204906 A1 | 7/2010 |
| EP | 2466746 A1 | 6/2012 |
| WO | 0225809 A2 | 3/2002 |

OTHER PUBLICATIONS

Nakatani et al., "Digitally-Controlled Polar Transmitter Using a Watt-Class Current-Mode Class-D CMOS Power Amplifier and Guanella Reverse Balun for Handset Applications", IEEE Journal of Solid-State Circuits, vol. 47, No. 5, May 2012, pp. 1104-1112.*
European First Examination Report dated dated Jul. 26, 2016 for corresponding European Regional Phase Application No. 13 156 507.9-1805, European Entry Date: Feb. 25, 2013 consisting of 6-pages.
Aoki et al.: "Distributed Active Transformer—A New Power-Combining and Impedance-Transformation Technique", ISSN No. 0018-9480, Published in IEEE Transactions on Microwave Theory and Techniques, vol. 50(1):316-331, Date of Publication: Jan. 2002, consisting of 16 pages.
Jen et al.: "A V-Band Fully-Integrated CMOS Distributed Active Transformer Power Amplifier for 802.15.TG3c Wireless Personal Area Network Applications", ISBN No. 978-1-4244-1940-1, Published in IEEE Compound Semiconductor Integrated Circuits Symposium (CSICS), 2008, pp. 1-4, Conference held Oct. 12-15, 2008, Monterey, CA, USA consisting of 4 pages.
Solomko et al.: "A Fully Integrated 3.3-3.8-GHz Power Amplifier with Autotransformer Balun", IEEE Transactions on Microwave Theory and Techniques, Issue Date: Sep. 2009, ISSN: 0018-9480, vol. 57(9):2160-2172, Date of Publication: Aug. 11, 2009, consisting of 13 pages.
Bameri et al.: "A DC to 20 GHz Ultra-Broadband High-Gain-Linear Distributed Power Amplifier with 19.5% Drain Efficiency", ISBN 978-1-4244-6760-0, Published in IEEE Electrical Engineering (ICEE), pp. 409-412, 2010 18th Iranian Conference held in Isfahan, Iran on May 11-13, 2010 consisting of 4 pages.
Meshcheriakov et al.: "Fully Monolithically Integrated X-Band Power Amplifier without External Matching", Published in Ph.D. Research in Microelectronics and Electronics (prime), Conference held in Berling, Germany on Jul. 18-21, 2010 consisting of 4 pages.
Pallotta et al.: "Milimeter-Wave 14dBm CMOS Power Amplifier with Input-Output Distributed Transformers", ISBN No. 978-1-4244-5760-1, Published in IEEE Custom Integrated Circuits Conference (CICC), pp. 1-4, Conference held in San Jose, CA USA on Sep. 19-22, 2010 consisting of 4 pages.
Tuffery et al.: "A 27.5-dBm Linear Reconfigurable CMOS Power Amplifier for 3GPP LTE Applications", ISBN No. 978-1-61284-137-3, Published in IEEE New Circuits and Systems Conference (NEWCAS), pp. 221-224, IEEE 9th International Conference held in Bordeaux, France on Jun. 26-29, 2011 consisting of 4 pages.
Kim et al.—"A Fully-Integrated High-Power Linear CMOS Power Amplifier With a Parallel-Series Combining Transformer", ISSN No. 0018-9200, Published in IEEE Journal of Solid-State Circuits, vol. 47(3):599-614, Issue Date: Mar. 2012, Publication Date: Feb. 6, 2012, consisting of 16-pages.
Extended European Search Report dated Jun. 5, 2013 for corresponding European Phase Application No. 1 315 6507.9-1805, European Entry Date: Feb. 25, 2013 consisting of 7-pages.
International Search Report and Written Opinion dated Mar. 19, 2014 for International Application No. PCT/EP2014/053223, International Filing Date Feb. 19, 2014 consisting of 14 pages.

(56) References Cited

OTHER PUBLICATIONS

Chinese Language and English Translation of 1st Office Action dated Feb. 22, 2017 for corresponding Chinese National Stage Application No. 201480010241.2, Chinese Entry Date: Feb. 19, 2014 consisting of 18-pages.

\* cited by examiner

DISTRIBUTED POWER AMPLIFIER CIRCUIT

TECHNICAL FIELD

The present invention relates to a distributed power amplifier circuit.

BACKGROUND

CMOS (Complementary Metal Oxide Semiconductor) technology is a relatively cheap solution, e.g. compared with III-V compound semiconductor technologies, such as GaAs, InP, and InGaP. For mobile wireless communication equipment, such as a mobile handset or other user equipment (UE), it could thus be desirable to employ CMOS for the radio frequency (RF) front-end circuitry, such as power amplifiers (PAs). However, there are some challenges that have to be sorted out. One issue is that because the breakdown voltage for CMOS devices is relatively low, it is difficult to have a CMOS PA that can deliver enough RF power required for the radio communication standards. LDMOS (laterally diffused metal oxide semiconductor) transistors, having higher break-down voltage than normal MOS transistors, and can be used in RF/microwave power amplifier design. Another issue is that, due to a high peak-to-average power ratio (PAPR) of OFDM-(Orthogonal Frequency-Division Multiplexing)-based modulation schemes, like 3GPP (3rd Generation Partnership Program) LTE (Long Term Evolution), an average output power level of a PA normally is backed off from the peak output power level by 6-9 dB. Therefore, the power efficiency of the PA is reduced substantially. To reach high power efficiency, Doherty-type PAs are used in base station PA design operating at a specific frequency band. However, for a mobile handset (and other relatively small equipment), this is not as feasible e.g. due to the limited available space, which can make it difficult to implement a quarter wave length transmission line, and the difficult to tune the delay/phase shift of the transmission line or passive components in a wide frequency range which a UE generally must cover.

A solution that can be used in such smaller equipment is the so called distributed active transformers (DAT), which combine the outputs of the multiple uniformed small PA units into one output and thus reduce the peak power level required for each PA unit. By reconfigurable arrangement, the DAT can be adapted to different power levels. An example of such a circuit is e.g. disclosed in Kim J et al. "A fully-integrated high-power linear CMOS power amplifier with a parallel-series combining transformer", IEEE Journal of Solid-State Circuits, Vol. 47, No. 3, pp 599-613, 2012 (In the following referred to as "Kim et al").

It is generally desirable to further improve the power efficiency of PAs, e.g. to reduce the dissipated heat and/or to improve battery time for battery-powered equipment.

SUMMARY

An object of the present invention is to provide a power amplifier with relatively good power efficiency.

According to a first aspect, there is provided a distributed power amplifier (PA) circuit. The distributed PA circuit comprises an amplifier arrangement comprising a plurality of sub amplifiers, each having an output port for outputting an output signal of the sub-amplifier. Furthermore, the distributed PA circuit comprises an output combiner network for combining the output signals from the sub amplifiers. The output combiner network comprises, for each sub amplifier, an associated auto transformer operatively connected to the output port of the sub amplifier for receiving the output signal of the sub amplifier. The auto transformers each have a first interconnection terminal and a second interconnection terminal. The auto transformers are operatively connected in series via said interconnection terminals, thereby forming a chain of auto transformers having a first end and a second end. Said first end is arranged to be connected to an antenna.

The sub-amplifiers may have differential output ports, each having a first output terminal and a second output terminal Each auto transformer may comprise a first inductor segment between its first interconnection terminal and a first input terminal of the auto transformer. Furthermore, each auto transformer may comprise a second inductor segment between its first input terminal and a second input terminal of the auto transformer. Moreover, each auto transformer may comprise a third inductor segment between its second input terminal and its second interconnection terminal For each sub amplifier, the first output terminal and the second output terminal may be operatively connected to the first input terminal and the second input terminal, respectively, of the associated auto transformer.

For each of the auto transformers, an internal tap of the second inductor segment of that auto transformer may be operatively connected to a power-supply node for supplying power to the sub amplifier associated with that auto transformer.

Some embodiments of the distributed PA circuit are such that for a first auto transformer, associated with a first sub amplifier, and a second auto transformer, located adjacent the first auto transformer in said chain of auto transformers and associated with a second sub amplifier, said internal tap of the second inductor segment of the first auto transformer is connected to a first power-supply node and said internal tap of the second inductor segment of the second auto transformer is connected to a different second power-supply node for supplying a different supply voltage to the second sub amplifier than to the first sub amplifier. Said chain of autotransformers may comprise a capacitor operatively connected in series with the auto transformers between the first auto transformer and the second auto transformer.

In some embodiments, one or more of the sub-amplifiers are configurable for operation in an enabled state and a disabled state. The sub amplifiers may be arranged such that, in operation and when one or more of the sub amplifiers are set in the disabled state, these are the sub amplifiers whose associated auto transformers are closest to the second end of the chain of auto transformers. The amplifier arrangement may comprise, for at least one interconnection terminal (i.e., one interconnection terminal or a plurality of interconnection terminals) of an auto transformer in the chain of auto transformers, an associated configuration switch operatively connected between that interconnection terminal and a signal ground node. Said configuration switch may be arranged to be conducting when the sub amplifiers, whose associated auto transformers are connected between that interconnection terminal and the second end of the chain of auto transformers, are set in the disabled state and the other sub amplifiers are set in the enabled state. Furthermore, said configuration switch may be arranged to be non-conducting when at least one of the sub amplifiers, whose associated auto transformers are connected between that interconnection terminal and the second end of the chain of auto transformers, is set in the enabled state.

According to a second aspect, there is provided an integrated circuit package comprising the distributed power amplifier circuit according to the first aspect. The integrated circuit package may comprise a semiconductor chip on which the amplifier arrangement is integrated. Furthermore, the integrated circuit package may comprise a laminate of electrically conducting and non-conducting materials in which the auto transformers are formed.

According to a third aspect, there is provided a communication apparatus comprising the distributed power amplifier circuit according to the first aspect or the integrated circuit package according to the second aspect. The communication apparatus may e.g. be a radio communication apparatus, such as but not limited to a user equipment for a cellular communication system, a base station for a cellular communication system or an access point for a wireless network.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
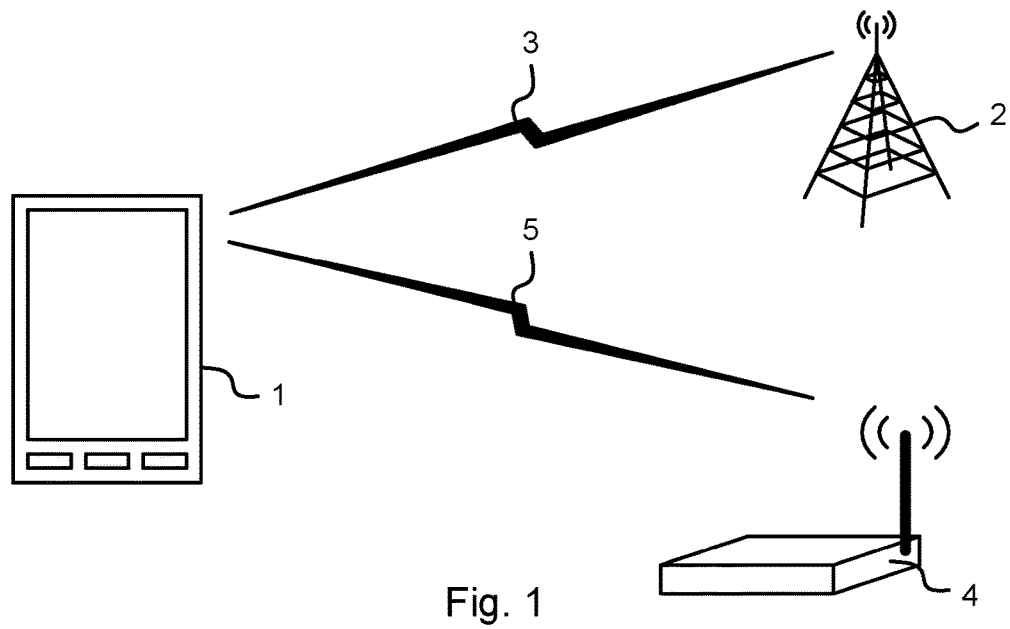
FIG. 1 schematically illustrates a communication environment according to an example.

FIG. 1 illustrates schematically an environment wherein embodiments of the present invention can be employed. A user equipment (UE) 1, shown in FIG. 1 as a mobile telephone (or "cellular telephone" or "mobile handset") is wirelessly connected to a radio base station (BS) 2 of a cellular communication system via a wireless (radio) communication link 3. As a non-limiting example, the cellular communication system may be a 3GPP (3rd Generation Partnership Program) LTE (Long Term Evolution) cellular communication system, in which case the BS 2 may e.g. be a so called eNodeB. A UE in this context may e.g. be a mobile phone, a cellular data modem, a personal computer or other equipment comprising such a cellular data modem.

Additionally or alternatively, as indicated in FIG. 1, the UE 1 may be wirelessly connected to an access point (AP) 4, or other equipment, of a non-cellular network, such as but not limited to a wireless local area network (WLAN), e.g. complying with one or more of the various IEEE 802.11 standards, via a wireless (radio) communication link 5.

The UE 1, the BS 2, and the AP 4 are nonlimiting examples of what is referred to below generically with the term radio communication apparatus. Although such radio communication apparatuses are used as examples in this description, it should be noted that the power amplifier circuitry described herein can be employed in other types of communication apparatuses as well, such as wireline communication apparatuses.

Figure 2:
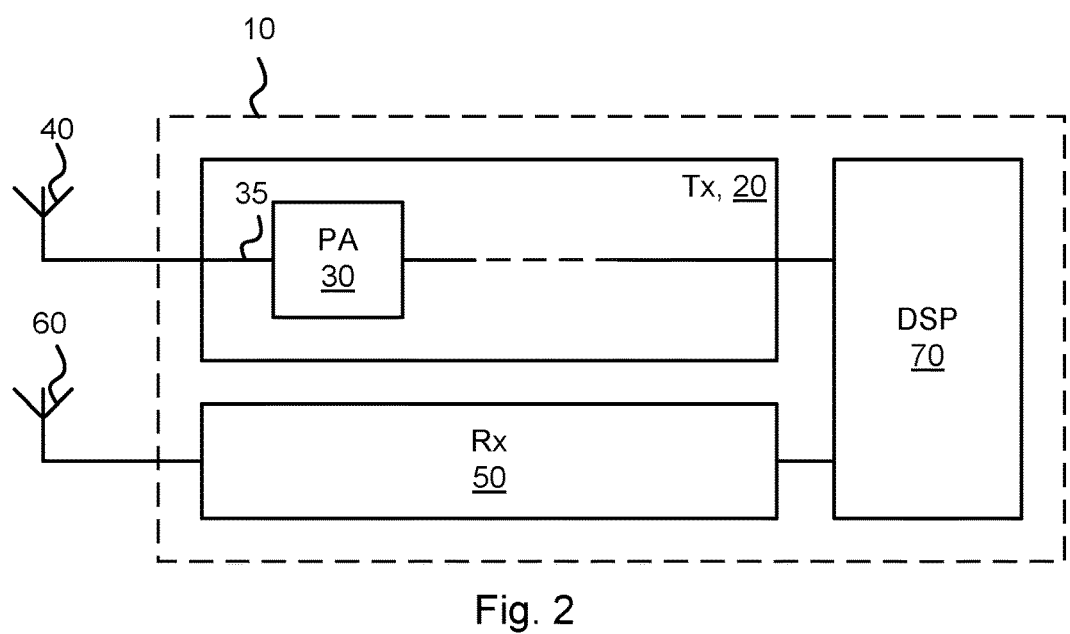
FIG. 2 is a simplified block diagram of a radio transceiver circuit according to an embodiment of the present invention.

A radio communication apparatus typically comprises one or more radio transceiver circuits. A simplified block diagram of a radio transceiver circuit 10 according to some embodiments of the present invention is illustrated in FIG. 2. In FIG. 2, the radio transceiver circuit 10 comprises a transmitter circuit 20. The transmitter circuit 20 comprises a distributed PA circuit 30, details of which are described below in the context of various embodiments. The distributed PA circuit 30 has an output port 35 arranged to be connected to an antenna 40. The antenna 40 may or may not be part of the transceiver circuit 10 (in FIG. 2, the antenna 40 is illustrated as external to the transceiver circuit 10). The transmitter circuit 20 may comprise circuitry preceding the distributed PA circuit 30, such as one or more digital-to-analog converters (DACs), mixers, filters, and/or buffer amplifiers, as indicated in FIG. 2 with a dashed line. The design of such circuitry, per se, is well known in the art of radio transceiver design and is therefore not further described herein.

Furthermore, in FIG. 2, the radio transceiver circuit 10 comprises a receiver circuit 50 arranged to be connected to an antenna 60 at an input port of the receiver circuit 50. The antenna 40 may or may not be part of the transceiver circuit 10 (in FIG. 2, the antenna 40 is illustrated as external to the transceiver circuit 10). Although the example shown in FIG. 2, for illustrative purposes, is illustrated with a separate transmit antenna 40 and a separate receive antenna 60, other antenna arrangements may be used in some embodiments. For example, in some embodiments, the transmitter circuit 20 and the receiver circuit 50 may share a common antenna, for example via a duplex filter. In some embodiments, multiple antennas may be used for reception and/or transmission (e.g. to achieve so called MIMO (Multiple Input Multiple Output or diversity), and some or all of these multiple antennas may be shared between the transmitter circuit 20 and the receiver circuit 50.

Moreover, in FIG. 2, the radio transceiver circuit 10 comprises a digital signal processor (DSP) 70, such as a baseband processor or the like, arranged to provide input to the transmitter circuit 20 and receive output from the receiver circuit 50. The DSP 70 may also be arranged to provide general control of circuitry of the transmitter circuit 10 and/or the receiver circuit 50.

Figure 3:
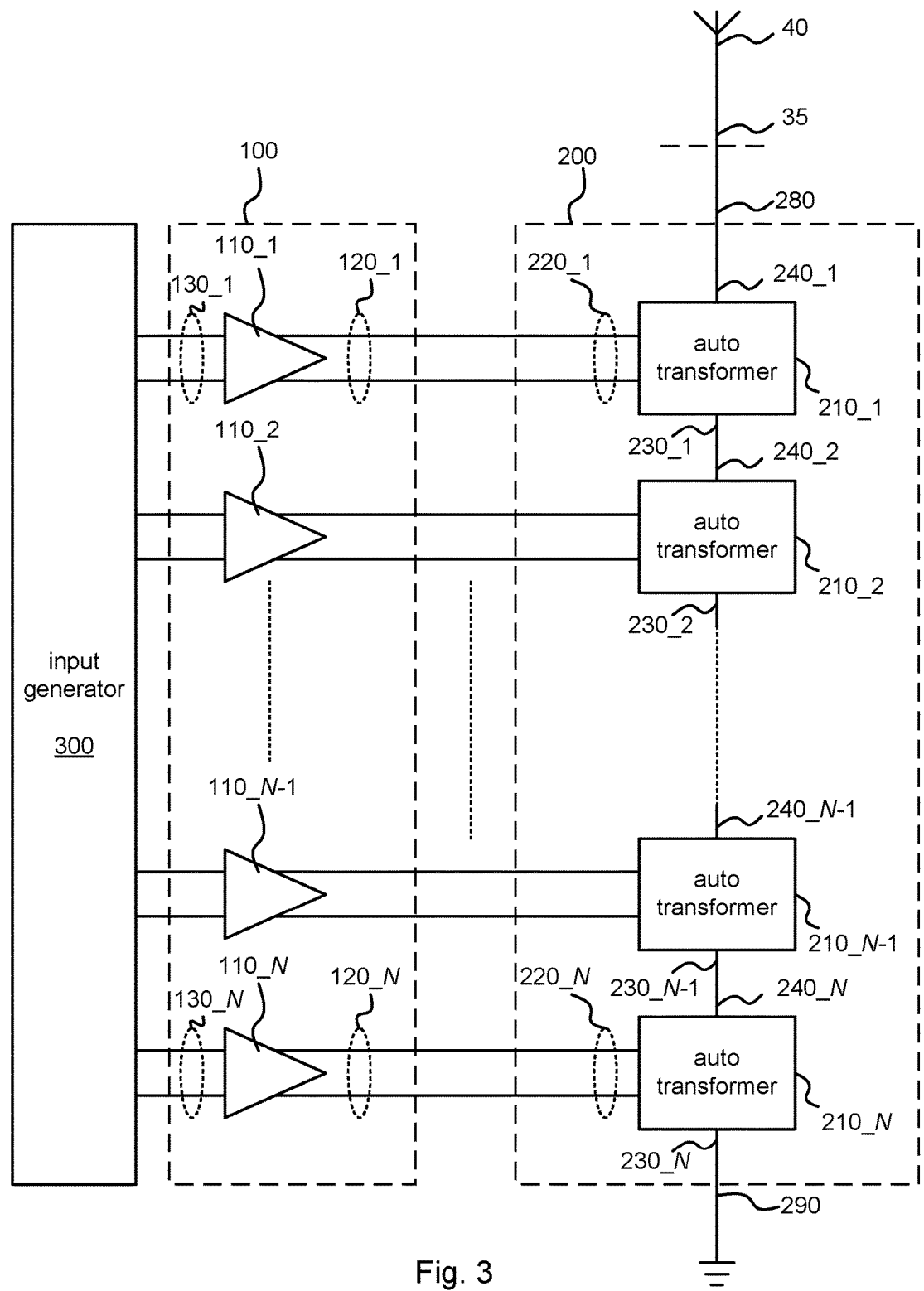
FIG. 3 is a schematic circuit diagram of a distributed power amplifier circuit according to embodiments of the present invention.

FIG. 3 is a schematic circuit diagram of the distributed PA circuit 30 according to embodiments of the present invention. In FIG. 3, the distributed PA circuit 30 comprises an amplifier arrangement 100. The amplifier arrangement 100 comprises a plurality of sub amplifiers 110_1-110_N. Each of the sub amplifiers 110_1-110_N has an output port 120_1-120_N for outputting an output signal of the sub-amplifier 110_1-110_N. Furthermore, the distributed PA circuit 30 comprises an output combiner network 200 for combining the output signals from the sub amplifiers 110_1-110_N. The output combiner network 200 comprises, for each sub amplifier 110_i (where the index i adopts values in the range [1, N]), an associated auto transformer 210_i operatively connected to the output port 120_i of the sub amplifier 110_i for receiving the output signal of the sub amplifier 110_i. Auto transformers are sometimes also referred to as "self-coupled transformers". In FIG. 3, an input port 220_i of the associated auto transformer 210_i is connected to the output port 120_i of the sub amplifier 110_i for receiving the output signal of the sub amplifier 110_i. For readability, reference signs for said output and input ports 120_i and 220_i are only explicitly shown in FIG. 3 for i=1 and i=N.

The auto transformers 210_1-210_N each have a first interconnection terminal 240_1-240-N and a second interconnection terminal 230_1-230_N. The auto transformers 210_1-210_N are operatively connected in series via said interconnection terminals 230_1-230_N; 240_1-240_N. Thereby, a chain of auto transformers 210_1-210_N is formed. Said chain of auto transformers 210_1-210_N has a first end 280 and a second end 290. The first end 280 is arranged to be connected to an antenna. This is illustrated in FIG. 3 with the inclusion of the antenna 40 in the drawing (connected to the first end 280 via the output port 35 of the distributed PA circuit 30). The second end 290 of the chain of auto transformers 210_1-210_N may e.g. be connected to a signal ground node, as indicated in FIG. 3.

The use of auto transformers (which have a single winding as is described further below in the context of various embodiments) provides for a relatively high efficiency, e.g. compared with distributed PA circuits utilizing coupling (or isolation) transformers (having primary and secondary windings) for combining, which have a comparably higher insertion loss than auto transformers, primarily due to losses in the coupling between the primary and secondary winding. Thus, in this respect, embodiments of the present invention, using auto transformers 210_1-210_N in the output combiner network 200, have an efficiency advantage over distributed PA circuits using coupling transformers for combining sub-amplifier output signals (such as that described in the Kim et al article mentioned above in the background).

Included in FIG. 3 is also an input generator 300 arranged to generate input signals to the sub amplifiers 110_1-110_N. The input generator 300 is arranged to generate said input signals such that a desired output signal of the distributed PA circuit 30 (fed to the antenna 40) is obtained. The input generator 300 can in some embodiments be seen as part of the distributed PA circuit 30, and can in other embodiments be considered as external to the distributed PA circuit 30.

In some embodiments, the input generator 300 is adapted to generate identical input signals to all sub amplifiers 110_1-110_N, except for that a mutual delay can be required to account for different delays through the output combiner network 200 for different sub amplifiers 110_1-110_N. In some embodiments, the input generator 300 is adapted to generate identical input signals to all sub amplifiers 110_1-110_N, except for a linear scaling factor between different input signals (again, a mutual delay can be required to account for different delays through the output combiner network 200 for different sub amplifiers 110_1-110_N). The input generator 300 may comprise a centralized RF driver. Furthermore, the input generator 300 may comprise delay-matched transmission lines for distributing an output signal of the centralized RF driver, suitably delayed, as input signals to the sub amplifiers 110_1-110_N. As is further elaborated below, individual sub amplifiers 110_1-110_N can, in some embodiments, be selectively enabled or disabled. In such embodiments, the terminology "all sub amplifiers 110_1-110_N" in the previous sentences should be interpreted as "all enabled sub amplifiers 110_1-110_N". Furthermore, depending on the linearity of the sub amplifiers 110_1-110_N and the corresponding linearity requirements (e.g. compliance with a spectral mask) on the application in which the distributed PA circuit 30 is to be used, the input generator 300 may further be adapted to apply predistortion to the input signals provided to the sub amplifiers 110_1-110_N to compensate for the nonlinearities of the sub amplifiers 110_1-110_N. Numerous predistortion techniques are known in the art of PA design, and predistortion is therefore not further discussed herein in any greater detail.

Figure 4:
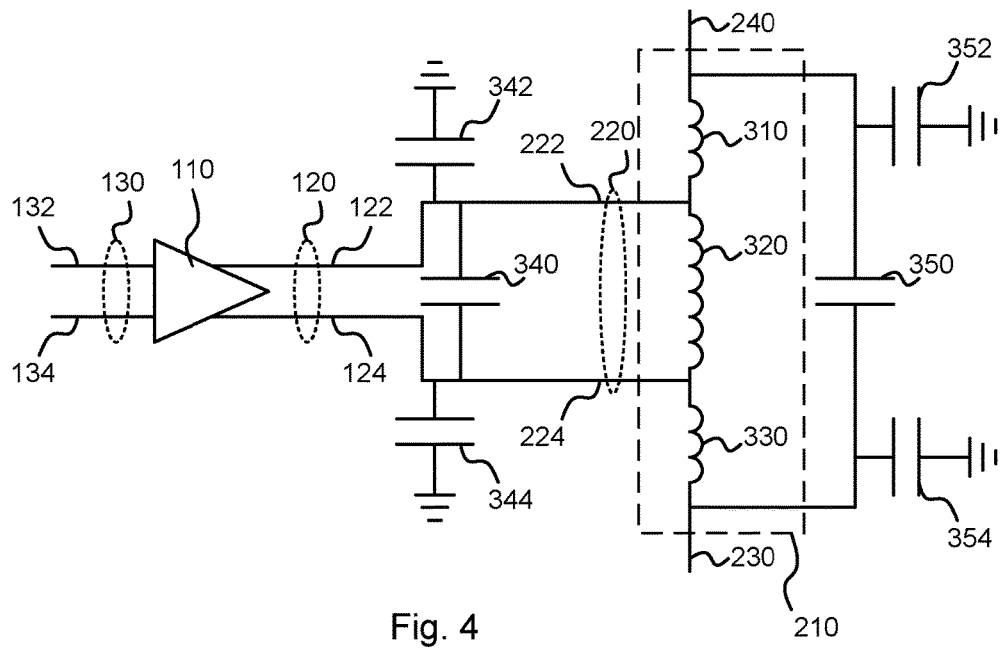
FIGS. 4-8 are schematic circuit diagrams of parts of a distributed power amplifier according to embodiments of the present invention.
Figure 5:
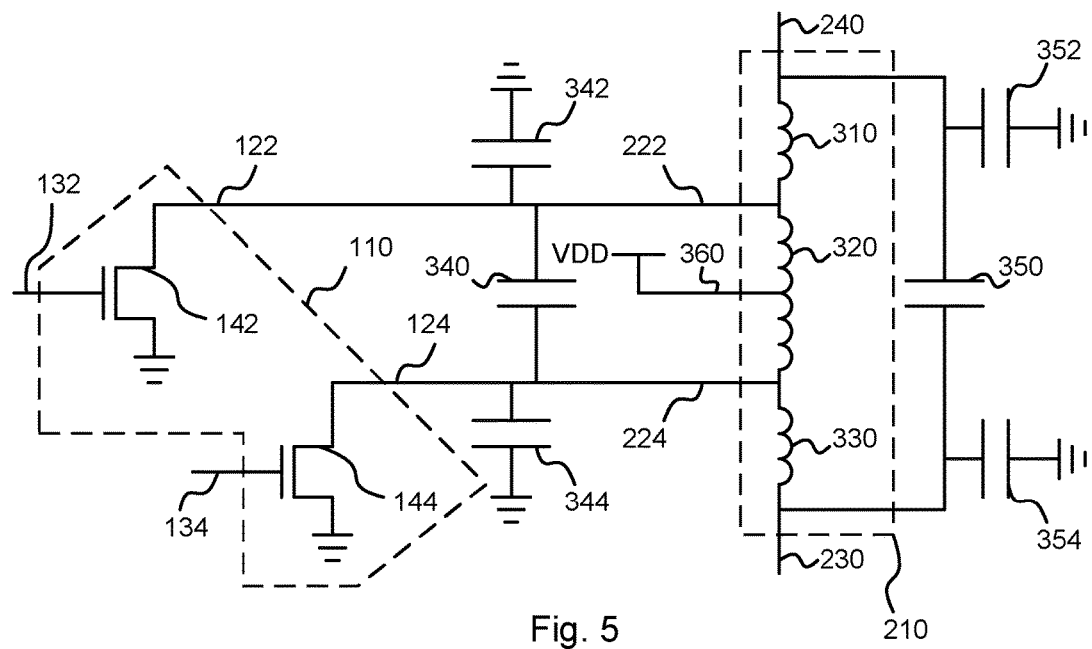

FIG. 4 is a schematic circuit diagram of part of the distributed PA circuit 30 according to some embodiments of the present invention. In FIG. 4, it is illustrated in more detail (than in FIG. 3) how the auto transformers 210_1-210_N can be implemented. FIG. 4 also shows a sub amplifier 110 and its connection to its associated auto transformer 210. Since a single sub amplifier 110 and a single auto transformer 210 are shown in FIG. 5, the index (i.e. i in 110_i and 210_i, etc.) has been dispensed with in FIG. 4 for readability. The same goes for FIG. 5. Each of the auto transformers 210_1-210_N can be implemented as the auto transformer 210 shown in FIG. 4. Furthermore, each of the auto transformers 210_1-210_N can be connected to its associated sub amplifier 110_1-110_N as the auto transformer is shown in FIG. 4 to be connected to its associated sub amplifier 200. Again, the same goes for FIG. 5. Indices are used in figures where several sub amplifiers and auto transformers are included, to distinguish between individual sub amplifiers and auto transformers.

In FIG. 4, the sub-amplifier 110 has a differential output port 120. The differential output port has a first output terminal 122 and a second output terminal 124 (e.g. a "positive output terminal" and a "negative output terminal", or vice versa). As is also shown in FIG. 4, the sub amplifier 110 may have a differential input fort 130, having a first input terminal 132 and a second input terminal 134 224 (e.g. a "positive input terminal" and a "negative input terminal", or vice versa). Furthermore, in FIG. 4, the auto transformer 210 has a differential input port 220. The differential input port has a first input terminal 222 and a second input terminal 224 (e.g. a "positive input terminal" and a "negative input terminal", or vice versa). Moreover, in FIG. 4, the auto transformer 200 comprises a first inductor segment 310 between its first interconnection terminal 240 and its first input terminal 222, a second inductor segment 320 between its first input terminal 222 and its second input terminal 224, and a third inductor segment 330 between its second input terminal 224 and its second interconnection terminal 230. The first inductor segment 310, the second inductor segment 320, and the third inductor segment 330 together form a single winding of the auto transformer 210 (in contrast to coupling transformers having a primary and a secondary winding, as mentioned above). The first output terminal 122 and the second output terminal 124 of the sub amplifier 110 is operatively connected to the first input terminal 222 and the second input terminal 224, respectively, of the associated auto transformer 210_i.

According to some embodiments, the auto transformer 210 has one or more capacitors connected to it (or alternatively, the capacitors may be seen as part of the auto transformer 210). The capacitors may be tunable, or adjustable, for tuning a resonance frequency of the auto transformer 200. FIG. 4 shows an example topology of how said capacitors can be connected, showing a capacitor 340 between the input terminals 222 and 224, a capacitor 342 between the first input terminal 222 and signal ground, a capacitor 344 between the second input terminal 224 and signal ground, a capacitor 350 between the connection terminals 230 and 240, a capacitor 352 between the first interconnection terminal 230 and signal ground, and a capacitor 354 between the second interconnection terminal 230 and signal ground, The resonance frequency may e.g. be tuned to maximize the output power, or to create desired matching for the cascaded configuration where the output of several sub amplifiers is merged. Note that the tuning for each auto transformer 210_i may be different for different i.

According to some embodiments, the output combiner network 200 is used also as a supply network for the sub amplifiers 110_1-110_N. This further provides relatively high power efficiency, since energy losses in a separate dedicated supply network can be avoided. Furthermore, the reuse of the output combiner network for supplying power to the sub amplifiers is also advantageous from a size perspective, since the additional use of circuit area that would be required for such a separate dedicated supply network can be avoided as well. An example of this is shown in FIG. 5. Many of the components shown in FIG. 5 are already described above in the context of FIG. 5, and are not further described here. In FIG. 5, an embodiment of the sub amplifier 110 is illustrated. As shown in FIG. 5, the sub amplifier 110 may comprise transistors 142 and 144 connected to the input terminals 132 and 134, respectively. In FIG. 5, the transistors 142 and 144 are shown as MOS (Metal-Oxide-Semiconductor) transistors, but may be of other types as well, e.g. bipolar junction transistors (BJTs). Furthermore, as shown in FIG. 5, an internal tap 360 (such as a center tap) of the second inductor segment 320 of the auto transformer 210 is connected to a power-supply node VDD for supplying power to the sub amplifier 110 associated with that auto transformer 210. Thus, in FIG. 5, power is supplied to the transistor 142 from the power supply node VDD via the "upper" (as the inductor segment 320 is oriented in FIG. 5) part of the second inductor segment 320. Similarly, in FIG. 5, power is supplied to the transistor 144 from the power supply node VDD via the "lower" (again, as the inductor segment 320 is oriented in FIG. 5) part of the second inductor segment 320.

Figure 6:
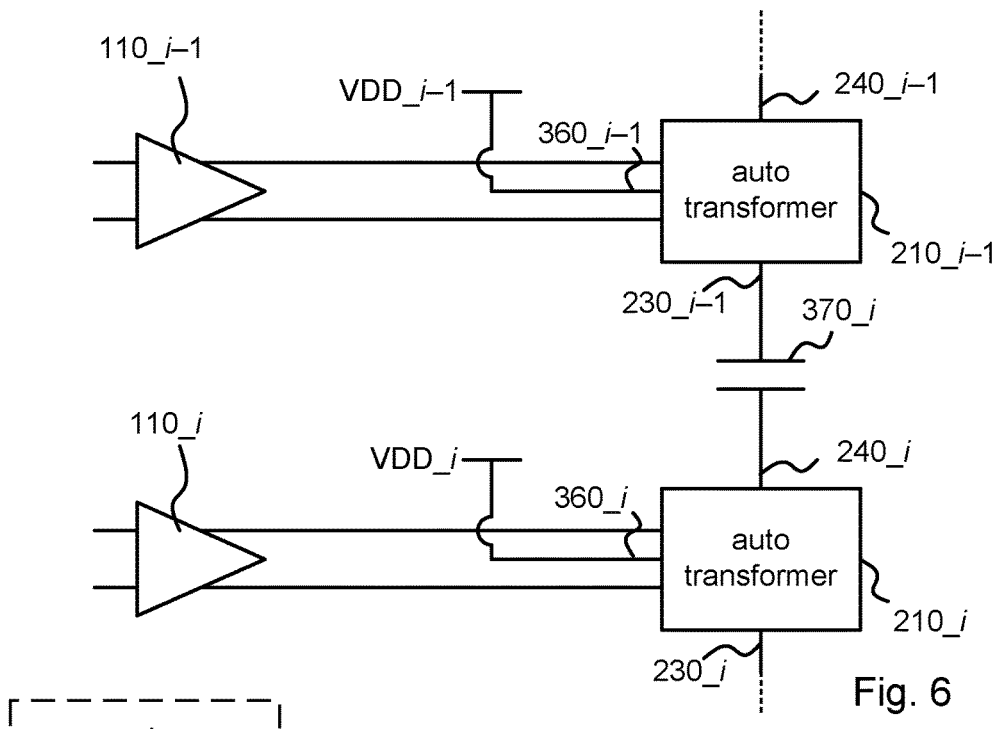

According to some embodiments, the sub amplifiers 110_1-110_N are supplied with the same supply voltage, e.g. from a common power supply node VDD. In other embodiments, at least some of the sub amplifiers are supplied with different supply voltages from different power supply nodes VDD_i. This is illustrated in FIG. 6, showing a first auto transformer 210_i, associated with a first sub amplifier 110_i, and a second auto transformer 210_i-1 located adjacent the first auto transformer 210_i in said chain of auto transformers and associated with a second sub amplifier 110_i-1. The word "adjacent" in this context refers to the electrical connectivity rather than to geometrical placement (even though they may be placed adjacent each other geometrically as well). As illustrated in FIG. 6, the internal tap 360_i of the second inductor segment 320 of the first auto transformer 210_i is connected to a first power-supply node VDD_i and the internal tap 360_i-1 of the second inductor segment 320 of the second auto transformer 210_i-1 is connected to a different second power-supply node VDD_i-1. Thereby, a different supply voltage can be supplied to the second sub amplifier 110_i-1 than to the first sub amplifier 110_i. The individual power supply to different sub amplifiers can e.g. be utilized to improve the overall power efficiency of the distributed PA circuit 30 (compared with a common supply voltage to all sub amplifiers), since the operating points of the sub amplifiers can be set individually (the supply voltage that gives the best power efficiency for one of the sub amplifiers is not necessarily the supply voltage that gives the best power efficiency for another sub amplifier).

When different supply voltages are used for different sub amplifiers, measures may be required for preventing DC-wise short circuits between individual power supply nodes. In FIG. 6, the chain of auto transformers 210_1-210_N comprises a capacitor 370_i operatively connected in series with the auto transformers 210_1-210_N between the first auto transformer 210_i and the second auto transformer 210_i-1. The capacitor 370_i provides a DC-wise open circuit between the power supply nodes VDD_i and VDD_i-1.

According to some embodiments, the power efficiency of the distributed PA circuit 30 can be improved by turning off one or more of the sub amplifiers 110_1-110_N, e.g. depending on the present required output power. For example, if maximum output power is required (which, in a cellular system, might happen if you are far away from a base station, e.g. close to the cell edge), then all sub amplifiers 110_1-110_N should be on, or "enabled". However, if less output power is required (which, again in a cellular system, might happen if you are closer to the base station), one or more of the sub amplifiers 110_1-110_N can be turned off, or "disabled", whereby energy can be saved (compared with having all sub amplifiers all sub amplifiers 110_1-110_N on). Accordingly, in some embodiments, one or more of the sub-amplifiers 110_1-110_N are configurable for operation in an enabled state (or "active state", or "on state") and a disabled state (or "inactive state", or "off state"). Setting a sub amplifier 110_i in a disabled state may e.g., in some embodiments, include shutting off or lowering the supply voltage to that sub amplifier 110_i. Additionally or alternatively, setting a sub amplifier 110_i in a disabled state may e.g., in some embodiments, include setting an input voltage to that sub amplifier 110_i (on terminals of the input port 130_i) to a level where transistors (e.g. 142 and 144, FIG. 5) are in an off-state, or sub-threshold state, by changing the bias voltage at the transistor gates. For MOS implementation, stacked common source and common gate configured topologies are often used for the sub amplifiers as to increase the break-down voltages of the combined sub amplifiers, and in such case the disabled state can be achieved by setting the bias voltage either at common gate transistors or at common source transistors, or at both.

According to some embodiments, the states (enabled/disabled) of the sub amplifiers 110_1-110_N are controlled such that the enabled sub amplifiers are in the upper part of FIG. 3, and the disabled sub amplifiers are in the lower part of FIG. 3 (where the border between the upper part and the lower part naturally depends on how many sub amplifiers are enabled and how many are disabled). Thus, according to these embodiments, the sub amplifiers 110_1-110_N are arranged such that, in operation and when one or more of the sub amplifiers 110_1-110_N are set in the disabled state, these are the sub amplifiers 110_i-110_N whose associated auto transformers 210_i-210_N are closest to the second end 290 of the chain of auto transformers 210_1-210_N (note that in this sentence, the index i is used to denote the disabled sub amplifier 110_i with the lowest index, rather than any arbitrary sub amplifier). This facilitates a further improvement of energy efficiency, in that it allows the part of the output combiner network 200 that has only disabled sub amplifiers 110_i-110_N connected to it to be disabled, or cut off, as well, thereby reducing, or more or less eliminating, insertion losses in the disabled part of the output combiner network. This is equivalent to place an AC ground to the lower node of the auto transformer 210_*i* in FIG. 3, thus shortens the length of the amplifier chain, reducing the insertion loss effectively. As is discussed in further detail below, this can e.g. be accomplished by means of operatively connecting an internal node (such as the interconnection terminal 240_*i* of the auto transformer 210_*i*) of the chain of auto transformers 210_1-210_N between the part that should be disabled, or cut off, to a signal ground node, e.g. by means of a switch (which in turn can be implemented by means of a transistor).

Figure 7:
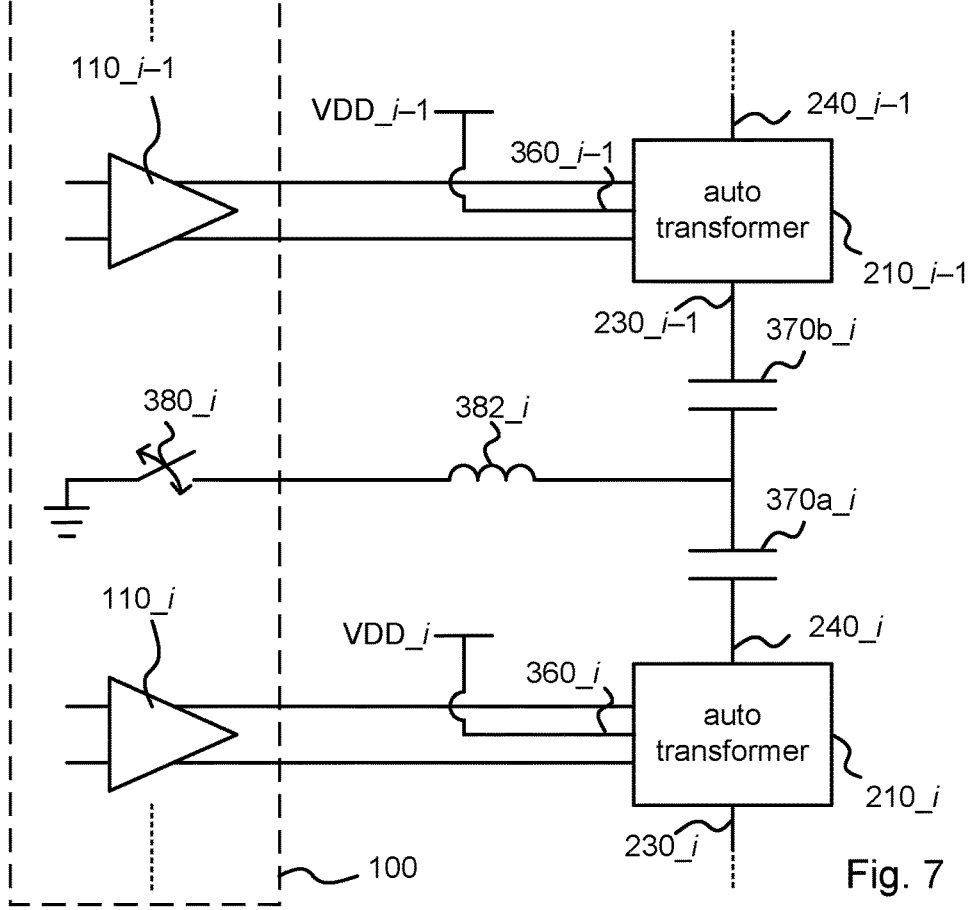
Figure 8:
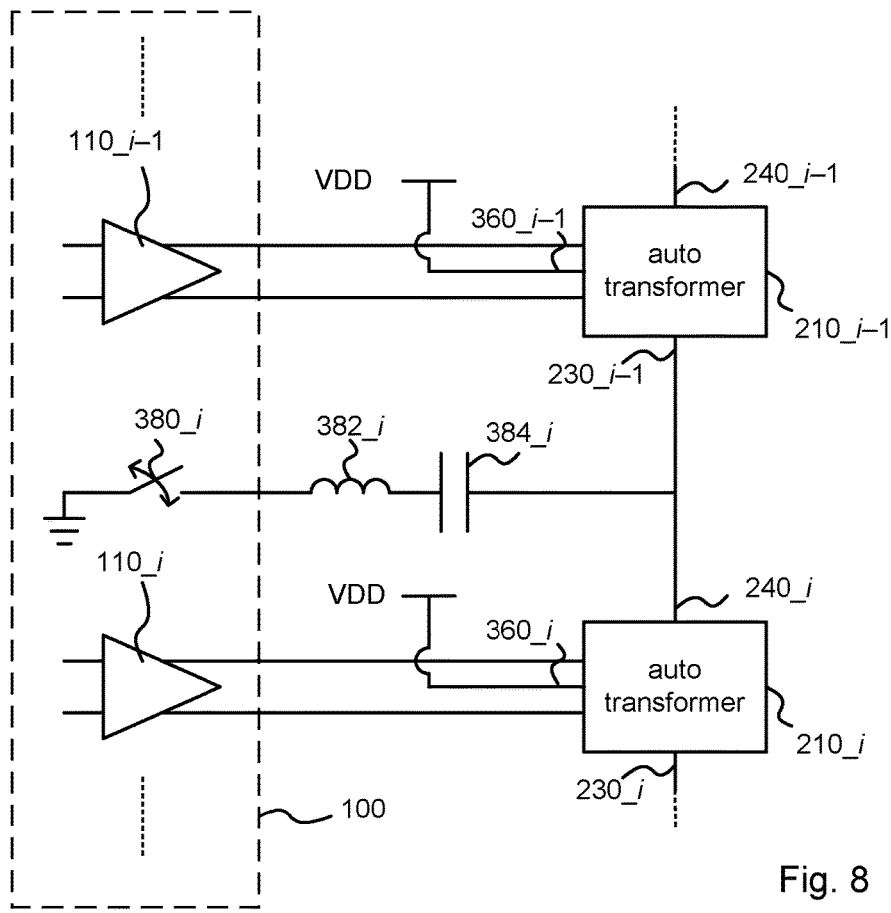

Examples of such embodiments are provided in FIGS. 7 and 8. FIG. 7 is described below first in the context where the sub amplifiers 110_*i*-110_N are to be set in the disabled state, and the other sub amplifiers 110_1-110_*i*−1 are to be set in the enabled state. FIG. 7 shows an example where the sub amplifiers 110_*i* and 110_*i*−1 have individual supply voltages. Compared with FIG. 6, the capacitor 370_*i* (FIG. 6) has been split into two series connected capacitors 370*a*_*i* and 370*b*_*i*. When the sub amplifier 110_*i* (and, unless i=N, each of the sub amplifiers 110_*i*+1-110_N) is in the disabled state and the sub amplifier 110_*i*−1 (and, unless i−1=1, each of the sub amplifiers 110_1-110_*i*−2) is in the enabled state, a switch 380_*i* (also referred to below as "configuration switch 380_*i*") of the amplifier arrangement 100, which is connected to the node between capacitors 370*a*_*i* and 370*b*_*i* via an inductor 382_*i*, is set to be conducting (or "closed"). The capacitors 370*a*_*i* and 370*b*_*i* act as blockers for DC currents between the signal ground node and the power supply nodes VDD_*i* and VDD_*i*−1. By selecting the resonance frequency of the series connection of capacitor 370*a*_*i* and the inductor 382_*i* at about a used RF frequency (such as a center frequency of an RF band used), a low-ohmic path to signal ground is provided from the interconnection terminal 240_*i*, whereby insertion losses in the auto-transformers 210_*i*-210_N can be largely reduced, or more or less eliminated. Next, let us consider the other situations, i.e. with either more or fewer disabled sub amplifiers than the sub amplifiers 110_*i*-110_N. For the case where more sub amplifiers 110_*i*−k-110_*i*−1 (where k is a nonzero integer) are in the disabled state as well, and there is another corresponding configuration switch "higher up the chain", say 380_*i*−k, that is set to be conducting, then the state of the configuration switch 380_*i* can be either non-conducting or conducting. For the case where the sub amplifier 110_*i* is in the enabled state, then the configuration switch 380_*i* should be set to be non-conducting (or "open"), in order not to effectively disconnect the sub amplifier 110_*i* from the antenna 40.

The operation in FIG. 8 is essentially the same as in FIG. 7. However, in FIG. 8, the capacitors 370*a*_*i* and 370*b*_*i* have been omitted, which is made possible through the use of the same supply voltage for the sub amplifiers 110_*i* and 110_*i*−1. A capacitor 384_*i* is connected in series with the inductor 382_*i* and the configuration switch 380_*i*. The capacitor 384_*i* acts as a blocker for DC currents between the signal ground node and the power supply node VDD. As for FIG. 7, when the sub amplifier 110_*i* (and, unless i=N, each of the sub amplifiers 110_*i*+1-110_N) is in the disabled state and the sub amplifier 110_*i*−1 (and, unless i−1=1, each of the sub amplifiers 110_1-110_*i*−2) is in the enabled state, the configuration switch 380_*i* of the amplifier arrangement 100, is set to be conducting (or "closed"). By selecting the resonance frequency of the series connection of capacitor 384_*i* and the inductor 382_*i* at about a used RF frequency (such as a center frequency of an RF band used), a low-ohmic path to signal ground is provided from the interconnection terminal 240_*i*, whereby insertion losses in the auto-transformers 210_*i*-210_N can be largely reduced, or more or less eliminated. As discussed above in the context of FIG. 7, for the case where more sub amplifiers 110_*i*−k-110_*i*−1 (where k is a nonzero integer) are in the disabled state as well, and there is another corresponding configuration switch "higher up the chain", say 380_*i*−k, that is set to be conducting, then the state of the configuration switch 380_*i* can be either non-conducting or conducting. Again as discussed above in the context of FIG. 7, for the case where the sub amplifier 110_*i* is in the enabled state, then the configuration switch 380_*i* should be set to be non-conducting (or "open"), in order not to effectively disconnect the sub amplifier 110_*i* from the antenna 40.

Different variations of the embodiments shown in FIGS. 7 and 8 are possible. For example, the circuit topology of FIG. 7, with the capacitors 370*a*_*i* and 370*b*_*i* included, can of course be used also when the sub amplifiers 110_*i* and 110_*i*−1 use the same supply voltage. As another example, the embodiments of FIGS. 7 and 8 can be combined, such that capacitors 370*a*_*i* and 370*b*_*i*, as well as capacitor 384_*i*, are present.

In view of the above examples, some embodiments are such that the amplifier arrangement 100 comprises, for at least one interconnection terminal 240_*i* of an auto transformer 210_*i* in the chain of auto transformers 210_1-210_N, an associated configuration switch 380_*i* operatively connected between that interconnection terminal 240_*i* and a signal ground node. In said embodiments, said configuration switch 380_*i* is arranged to be conducting when the sub amplifiers 110_*i*-110_N, whose associated auto transformers 210_*i*-210_N are connected between that interconnection 240_*i* terminal and the second end 290 of the chain of auto transformers 210_1-210_N, are set in the disabled state and the other sub amplifiers 210_1-210_*i*−1 are set in the enabled state. Furthermore, in said embodiments, said configuration switch 380_*i* is arranged to be non-conducting when at least one of the sub amplifiers 110_*i*-110_N, whose associated auto transformers 210_*i*-210_N are connected between that interconnection terminal 240_*i* and the second end 290 of the chain of auto transformers 210_1-210_N, is set in the enabled state.

In some embodiments, there is only one such interconnection terminal 240_*i* having an associated configuration switch 380_*i* in the distributed PA circuit 30. In other embodiments, there is a plurality of such interconnection terminals having an associated configuration switch 380_*i* in the distributed PA circuit 30. Adding more configuration switches 380_*i* facilitates an improvement in power efficiency, but a benefit of fewer configuration switches 380_*i* is a reduced circuit area overhead for switches and passive components.

In some embodiments, there is an associated configuration switch 380_*i* for each interconnection terminal 240_*i* for i=2, 3, . . . , N. Put in other words, in these embodiments, for each adjacent pair of auto transformers 210_*i*, 210_*i*−1, there is an associated configuration switch operatively connected between signal ground and an interconnection terminal 240_*i* (electrically located) between the auto transformers 210_*i* and 210_*i*−1 of said pair.

Figure 9:
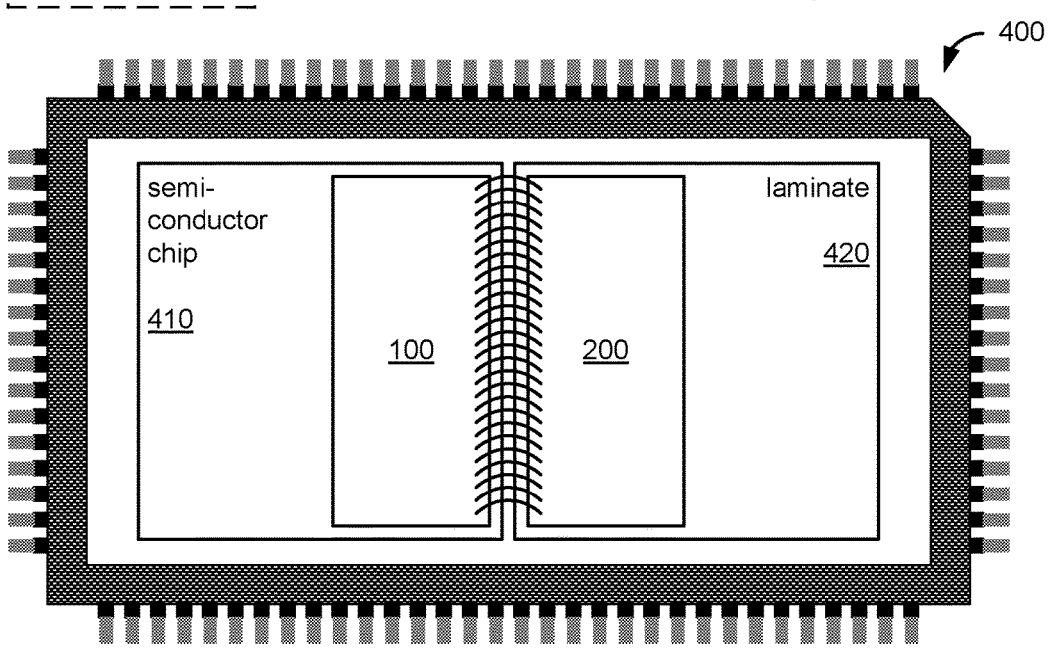
FIG. 9 illustrates an integrated circuit package comprising the distributed power amplifier circuit according to embodiments of the present invention.

Embodiments of the distributed PA circuit 30 can be beneficially implemented in a partitioned fashion, wherein the amplifier arrangement 100 (which comprises active components, such as transistors) is implemented "on chip", and the auto transformers 210_1-210-N (which comprises passive components) of the output combiner network 200 are implemented "off chip". This is illustrated with an embodiment in FIG. 9, which shows an integrated circuit package 400 that comprises the distributed PA circuit 30. In the embodiment illustrated in FIG. 9, the integrated circuit package 400 comprises a semiconductor chip 410 on which the amplifier arrangement 100 is integrated. Furthermore, in the embodiment illustrated in FIG. 9, the integrated circuit package 400 comprises a laminate 420 of electrically conducting and non-conducting materials in which the auto transformers 210_1-210_N are formed. The electrically conducting material of the laminate 420 may e.g. be a metal, such as copper, or a metal alloy. The non-conducting material of the laminate 420 may e.g. be a resin-based material, such as flame retardant 4 (FR-4). The laminate may e.g. be manufactured using a printed circuit board (PCB) manufacturing process. In FIG. 4, the semiconductor chip 410 and laminate 420 are illustrated as being placed side by side within the integrated circuit package 400, and connected via bond wires. However, other configurations are conceivable as well. For example, the laminate 420 may be placed "on top" of the semiconductor chip 410, and e.g. connected to the semiconductor chip via flip-chip bonding or similar technique.

Figure 10:
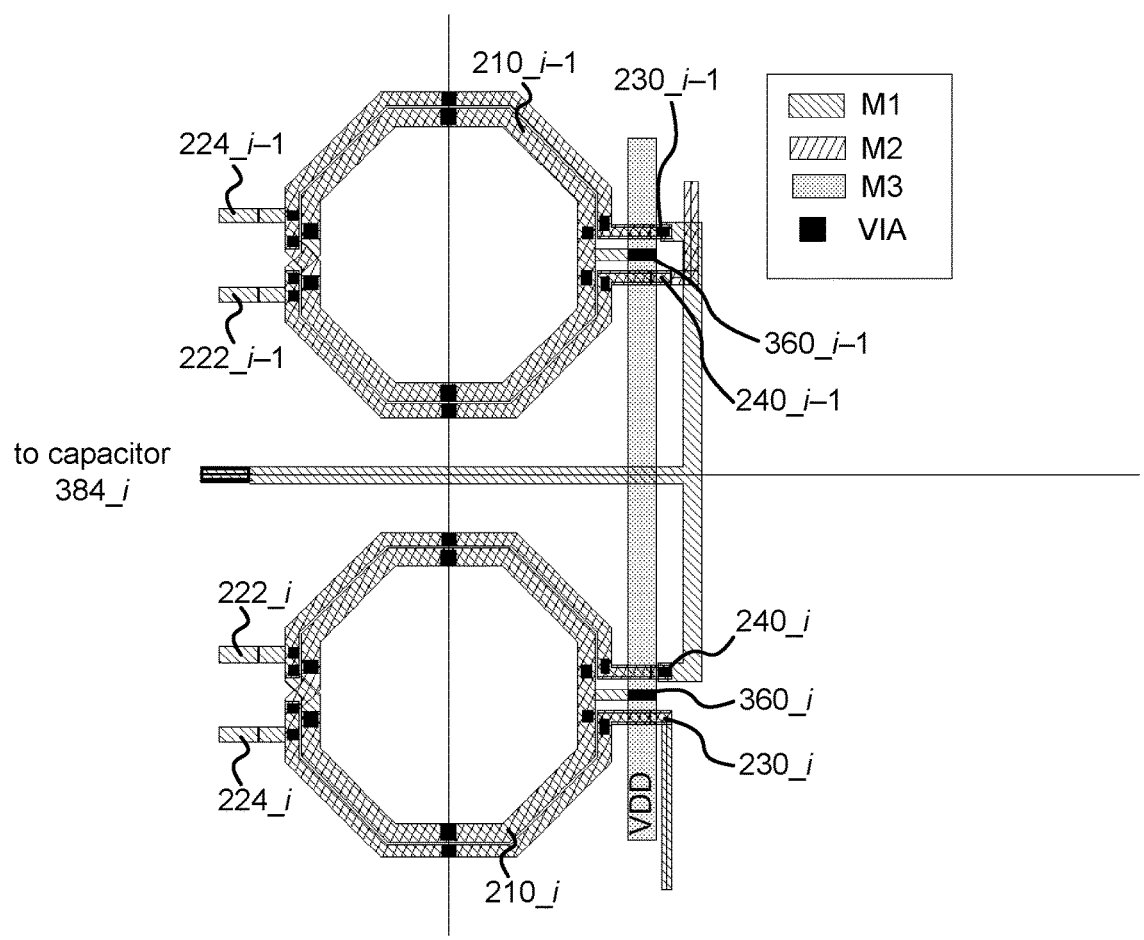
FIG. 10 is an exemplary layout of part of an output combiner network according to an embodiment of the present invention.

FIG. 10 illustrates a circuit layout of how the auto transformers 210_1-210_N may be formed in the electrically conducting material layers (illustrated in FIG. 10 as three metal layers M1, M2, and M3 connectable to each other using vias) of the laminate 420. Two adjacent auto transformers 210_i and 210_i+1 are shown in FIG. 10, which corresponds to (part of) the schematic circuit diagram of FIG. 8. Reference signs for terminals of the auto transformers 210_i and 210_i−1 have been included in FIG. 10 to illustrate the correspondence with FIG. 8. The layout used in FIG. 10 causes the currents in the auto transformers 210_i and 210_i−1 to have opposite "rotational directions", i.e. one clockwise and the other counter clockwise. This results in that electro-magnetic fields emanating from the auto transformers 210_i and 210_i−1 at least partly counteract each other, resulting in less interfering radiation being radiated to the surroundings (compared with if they would have the same "rotational direction").

As indicated in the beginning of this detailed description, a communication apparatus may comprise the distributed PA circuit 30 according to embodiments of the present invention. For example, the communication apparatus may comprise the radio transceiver circuit 10 and/or integrated circuit package 400, which in turn comprises the distributed PA circuit 30. As is also indicated in the beginning of this detailed description, the communication apparatus may be a radio communication apparatus, such as but not limited to the UE 1, the BS 2, or the AP 4.

The present invention has been described above with reference to specific embodiments. However, other embodiments than the above described are possible within the scope of the invention. The different features and steps of the embodiments may be combined in other combinations than those described. The scope of the invention is only limited by the appended patent claims.

The invention claimed is:

1. A distributed power amplifier circuit, comprising:
   an amplifier arrangement comprising a plurality of sub amplifiers, each having an output port for outputting an output signal of the sub-amplifier; and
   an output combiner network for combining the output signals from the sub-amplifiers, the output combiner network comprising, for each sub-amplifier, an associated auto transformer operatively connected to the output port of the sub-amplifier for receiving the output signal of the sub-amplifier;
   the auto transformers each having a first interconnection terminal and a second interconnection terminal;
   the auto transformers are operatively connected in series via said interconnection terminals, thereby forming a chain of auto transformers having a first end and a second end, said first end being arranged to be connected to an antenna, the chain of auto transformers including a capacitor operatively connected in series between two successive auto transformers in the chain of auto transformers and configured to decouple DC voltages associated with the two successive auto transformers;
   the sub-amplifiers having differential output ports, each having a first output terminal and a second output terminal, each auto transformer comprising:
      a first inductor segment between its first interconnection terminal and a first input terminal of the auto transformer;
      a second inductor segment between its first input terminal and a second input terminal of the auto transformer; and
      a third inductor segment between its second input terminal and its second interconnection terminal; and
   for each sub-amplifier, the first output terminal and the second output terminal is operatively connected to the first input terminal and the second input terminal, respectively, of the associated auto transformer.

2. The distributed power amplifier circuit of claim 1, wherein, for each of the auto transformers, an internal tap of the second inductor segment is operatively connected to a power-supply node for supplying power to the sub amplifier associated with that auto transformer.

3. The distributed power amplifier circuit of claim 2, wherein, for a first auto transformer, associated with a first sub amplifier, and a second auto transformer, located adjacent the first auto transformer in said chain of auto transformers and associated with a second sub amplifier, said internal tap of the second inductor segment of the first auto transformer is connected to a first power-supply node and said internal tap of the second inductor segment of the second auto transformer is connected to a different second power-supply node for supplying a different supply voltage to the second sub amplifier than to the first sub-amplifier.

4. The distributed power amplifier circuit of claim 1, wherein at least one of the sub-amplifiers is configurable for operation in an enabled state and a disabled state.

5. The distributed power amplifier circuit of claim 4, wherein the sub amplifiers are arranged such that, in operation and when at least one of the sub amplifiers is set in the disabled state, these are the sub-amplifiers whose associated auto transformers are closest to the second end of the chain of auto transformers.

6. The distributed power amplifier circuit of claim 5, wherein the amplifier arrangement comprises, for at least one interconnection terminal of an auto transformer in the chain of auto transformers, an associated configuration switch operatively connected between that interconnection terminal and a signal ground node, wherein said configuration switch is arranged to be:
   conducting when the sub-amplifiers, whose associated auto transformers are connected between that interconnection terminal and the second end of the chain of auto transformers, are set in the disabled state and the other sub-amplifiers are set in the enabled state; and
   non-conducting when at least one of the sub-amplifiers, whose associated auto transformers are connected between that interconnection terminal and the second end of the chain of auto transformers, is set in the enabled state.

7. The distributed power amplifier circuit of claim 6, wherein said at least one interconnection terminal is a plurality of interconnection terminals.

8. An integrated circuit package comprising:
a distributed power amplifier circuit comprising:
an amplifier arrangement comprising a plurality of sub amplifiers, each having an output port for outputting an output signal of the sub-amplifier; and
an output combiner network for combining the output signals from the sub-amplifiers, the output combiner network comprising, for each sub-amplifier, an associated auto transformer operatively connected to the output port of the sub-amplifier for receiving the output signal of the sub-amplifier;
the auto transformers each having a first interconnection terminal and a second interconnection terminal;
the auto transformers are operatively connected in series via said interconnection terminals, thereby forming a chain of auto transformers having a first end and a second end, said first end being arranged to be connected to an antenna, the chain of auto transformers including a capacitor operatively connected in series between two successive auto transformers in the chain of auto transformers and configured to decouple DC voltages associated with the two successive auto transformers;
the sub-amplifiers having differential output ports, each having a first output terminal and a second output terminal, each auto transformer comprising:
a first inductor segment between its first interconnection terminal and a first input terminal of the auto transformer;
a second inductor segment between its first input terminal and a second input terminal of the auto transformer; and
a third inductor segment between its second input terminal and its second interconnection terminal; and
for each sub-amplifier, the first output terminal and the second output terminal is operatively connected to the first input terminal and the second input terminal, respectively, of the associated auto transformer;
a semiconductor chip on which the amplifier arrangement is integrated; and
a laminate of electrically conducting and non-conducting materials in which the auto transformers are formed.

9. A communication apparatus comprising:
a distributed power amplifier circuit, the distributed power amplifier circuit comprising:
an amplifier arrangement comprising a plurality of sub amplifiers, each having an output port for outputting an output signal of the sub-amplifier; and
an output combiner network for combining the output signals from the sub-amplifiers, the output combiner network comprising, for each sub-amplifier, an associated auto transformer operatively connected to the output port of the sub-amplifier for receiving the output signal of the sub-amplifier;
the auto transformers each having a first interconnection terminal and a second interconnection terminal;
the auto transformers are operatively connected in series via said interconnection terminals, thereby forming a chain of auto transformers having a first end and a second end, said first end being arranged to be connected to an antenna, the chain of auto transformers including a capacitor operatively connected in series between two successive auto transformers in the chain of auto transformers and configured to decouple DC voltages associated with the two successive auto transformers;
the sub-amplifiers having differential output ports, each having a first output terminal and a second output terminal, each auto transformer comprising:
a first inductor segment between its first interconnection terminal and a first input terminal of the auto transformer;
a second inductor segment between its first input terminal and a second input terminal of the auto transformer; and
a third inductor segment between its second input terminal and its second interconnection terminal; and
for each sub-amplifier, the first output terminal and the second output terminal is operatively connected to the first input terminal and the second input terminal, respectively, of the associated auto transformer.

10. The communication apparatus of claim 9, wherein the communication apparatus is a radio communication apparatus.

11. The communication apparatus of claim 10, wherein the radio communication apparatus is a user equipment for a cellular communication system.

12. The communication apparatus of claim 10, wherein the radio communication apparatus is a base station for a cellular communication system.

13. The communication apparatus of claim 10, wherein the radio communication apparatus is an access point for a wireless network.

14. The communication apparatus of claim 9, further comprising an integrated circuit package, the integrated circuit package having the distributed power amplifier circuit, and the integrated circuit package further includes:
a semiconductor chip on which the amplifier arrangement is integrated; and
a laminate of electrically conducting and non-conducting materials in which the auto transformers are formed.

15. The communication apparatus of claim 14, wherein the communication apparatus is a radio communication apparatus.

16. The communication apparatus of claim 15, wherein the radio communication apparatus is a user equipment for a cellular communication system.

17. The communication apparatus of claim 15, wherein the radio communication apparatus is a base station for a cellular communication system.

18. The communication apparatus of claim 15, wherein the radio communication apparatus is an access point for a wireless network.

19. The distributed power amplifier circuit of claim 1, wherein at least one of the sub-amplifiers is configurable for operation in an enabled state and a disabled state.

* * * * *